United States Patent
Liao

(10) Patent No.: US 9,648,734 B2
(45) Date of Patent: May 9, 2017

(54) WAFERS, PANELS, SEMICONDUCTOR DEVICES, AND GLASS TREATMENT METHODS

(71) Applicant: Taiwan Semiconductor Manufacturing Company, Ltd., Hsin-Chu (TW)

(72) Inventor: Wen-Shiang Liao, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/679,557

(22) Filed: Apr. 6, 2015

(65) Prior Publication Data

US 2015/0216047 A1 Jul. 30, 2015

Related U.S. Application Data

(63) Continuation of application No. 13/802,484, filed on Mar. 13, 2013, now Pat. No. 9,012,912.

(51) Int. Cl.
*H01L 23/00* (2006.01)
*H05K 1/03* (2006.01)
(Continued)

(52) U.S. Cl.
CPC ........... *H05K 1/0306* (2013.01); *C03C 17/00* (2013.01); *G02F 1/00* (2013.01); *H01L 21/02592* (2013.01); *H01L 21/486* (2013.01); *H01L 21/4828* (2013.01); *H01L 23/49827* (2013.01); *H01L 23/49838* (2013.01); *H01L 23/49872* (2013.01); *H01L 23/49894* (2013.01);
(Continued)

(58) Field of Classification Search
CPC H05K 1/0306; H05K 1/115; H01L 21/02592; H01L 21/4828; H01L 21/486; H01L 23/49827; H01L 23/49838; H01L 23/49872; H01L 23/49894; H01L 23/562; C03C 17/00; G02F 1/00
See application file for complete search history.

(56) References Cited

U.S. PATENT DOCUMENTS 6,777,347 B1 8/2004 Ni et al.
2006/0046511 A1 3/2006 Shibata et al.
(Continued)

FOREIGN PATENT DOCUMENTS

| CN | 1317735 C | 5/2007 |
|---|---|---|
| CN | 102219393 A | 10/2011 |
| JP | 2012094668 A | 5/2012 |

OTHER PUBLICATIONS

Hossain, Maruf et al., "The Effect of Substrate Temperature and Interface Oxide Layer on Aluminum Induced Crystallization of Sputtered Amorphous Silicon," Mat. Res. Soc. Symp. Proc., vol. 808, 2004, pp. A4.22.1-A4.22.6.

(Continued)

*Primary Examiner* — Long Pham
(74) *Attorney, Agent, or Firm* — Slater Matsil, LLP

(57) ABSTRACT

Glass treatment methods, wafer, panels, and semiconductor devices are disclosed. In some embodiments, a method of forming a wafer or panel includes forming an opening through a glass substrate, forming a composite film on the glass substrate and on sidewalls of the opening, and filling the opening.

20 Claims, 5 Drawing Sheets

(51) Int. Cl.
    H01L 21/02      (2006.01)
    C03C 17/00      (2006.01)
    G02F 1/00       (2006.01)
    H01L 21/48      (2006.01)
    H01L 23/498     (2006.01)
    H05K 1/11       (2006.01)
    H01L 27/15      (2006.01)
    G02F 1/1333     (2006.01)

(52) U.S. Cl.
    CPC ............ *H01L 23/562* (2013.01); *H05K 1/115* (2013.01); *C03C 2217/425* (2013.01); *C03C 2218/365* (2013.01); *G02F 1/133345* (2013.01); *H01L 27/156* (2013.01); *H01L 2224/13* (2013.01); *H01L 2924/12044* (2013.01)

(56) References Cited

U.S. PATENT DOCUMENTS

| | | | |
|---|---|---|---|
| 2009/0212368 A1* | 8/2009 | Yang | H01L 21/82341 257/368 |
| 2011/0081769 A1 | 4/2011 | Takemura | |
| 2011/0095439 A1* | 4/2011 | Chin | H01L 23/3128 257/774 |
| 2012/0048604 A1 | 3/2012 | Cornejo et al. | |
| 2012/0050847 A1* | 3/2012 | Watanabe | C09K 19/14 359/352 |
| 2013/0059717 A1 | 3/2013 | Veerasamy et al. | |
| 2013/0171808 A1 | 7/2013 | Moslehi et al. | |
| 2013/0215513 A1 | 8/2013 | Liang et al. | |
| 2013/0240030 A1 | 9/2013 | Masolin et al. | |
| 2014/0034374 A1* | 2/2014 | Cornejo | C03C 15/00 174/264 |

OTHER PUBLICATIONS

Liao, Wen-Shiang, et al., "Novel Low-Temperature Double Passivation Layer in Hydrogenated Amorphous Silicon Thin Film Transistors," Jpn. J. Appl. Phys. vol. 36, Apr. 1997, pp. 2073-2076.

Liao, Wen-Shiang, et al., "Oxidation of Silicon Nitride Prepared by Plasma-enhanced Chemical Vapor Deposition at Low Temperature," Appl. Phys. Lett. 65(17), Oct. 24, 1994, pp. 2229-2231.

Liao, Wen-Shiang, et al., "Water-Induced Room-Temperature Oxidation of Si—H and -Si—Si- Bonds in Silicon Oxide," J. Appl. Phys., 80(2), Jul. 15, 1996, pp. 1171-1176.

* cited by examiner

__US 9,648,734 B2__

1

WAFERS, PANELS, SEMICONDUCTOR DEVICES, AND GLASS TREATMENT METHODS

PRIORITY CLAIM AND CROSS-REFERENCE

This application is a continuation of U.S. patent application Ser. No. 13/802,484, filed Mar. 13, 2013, and entitled "Wafers, Panels, Semiconductor Devices, and Glass Treatment Methods," which application is incorporated by reference herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components require smaller packages that utilize less area than packages of the past, in some applications.

One type of smaller packaging that has been recently developed is chip-on-wafer-on-substrate (CoWoS) packages, wherein one or more integrated circuit dies are mounted on a silicon interposer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to glass wafers and substrates used in semiconductor devices. Novel glass wafers and panels, glass treatment methods, interposers, LCD panels, and LED panels will be described herein.

Figure 1:
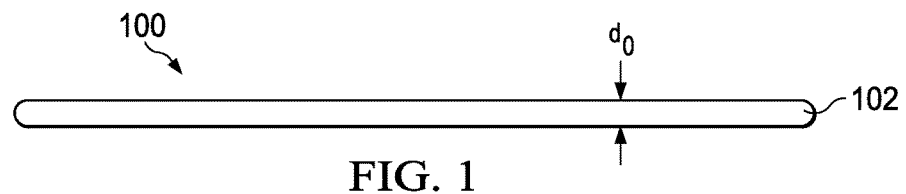
FIGS. 1 through 3 are cross-sectional views of a treatment method for a glass substrate in accordance with some embodiments of the present disclosure.
Figure 2:
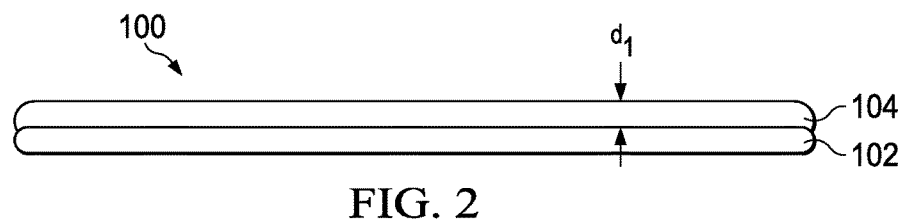
Figure 3:
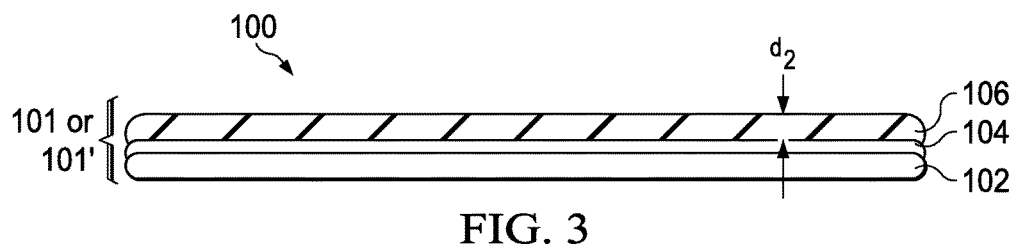

FIGS. 1 through 3 illustrate cross-sectional views of a treatment method for a glass substrate 102 in accordance with some embodiments of the present disclosure. Referring first to FIG. 1, a wafer or panel 100 is provided. The wafer or panel 100 comprises one or more glass substrates 102. The glass substrate 102 may comprise $SiO_2$, glass, quartz, an insulating dielectric material, or other materials in some embodiments. The glass substrate 102 comprises a thickness comprising dimension $d_0$ of about 500 μm or less in some embodiments. In other embodiments, dimension $d_0$ comprises 500 μm, 400 μm, 300 μm, 200 μm, 150 μm, 100 μm, or 50 μm, for example. In some embodiments, the glass substrate 102 includes mobile ions, such as Li, Na, K, Mg, other materials, or combinations thereof. The mobile ions may be intentionally added by a manufacturer of the glass substrate 102 to achieve predetermined properties for the wafer or panel 100, for example. Alternatively, the glass substrate 102 may comprise other materials and dimensions. The glass substrate 102 comprises a material that is processed and/or manufactured using a low temperature process in some embodiments, e.g., at a temperature of about 180 degrees C. or less. In some embodiments, the glass substrate 102 comprises a material that is processed or manufactured at room temperature, for example. The wafer or panel 100 comprises a glass substrate 102 commercially available from vendors such as Corning, Hoya, Asahi, Life BioScience Inc. (LBSI), Applied Materials, ULVAC, or other vendors, as examples. The wafer or panel 100 comprises a plurality of the interposers 101, LCD panels, or LED panels, with each interposer 101, LCD panel, or LED panel comprising one of the plurality of glass substrates 102 which are later singulated along scribe lines, to be described further herein, in some embodiments.

In accordance with some embodiments, the glass substrate 102 of the wafer or panel 100 is treated to prevent or reduce out-diffusion of the mobile ions in the glass substrate 102. To summarize, the novel treatment includes first, forming a first film 104 on a surface of the glass substrate 102, as shown in FIG. 2, and second, forming a second film 106 on the first film 104, as shown in FIG. 3. The first film 104 and the second film 106 comprise a composite film 104/106 that prevents or reduces out-diffusion of the mobile ions from the glass substrate 102 and also reduces or prevents warpage of the glass substrate 102.

The novel treatment method for a glass substrate 102 in accordance with some embodiments of the present disclosure will next be described in more detail. Referring again to FIG. 2, the first film 104 is formed on a surface of the glass substrate 102 using a chemical vapor deposition (CVD) process. In some embodiments, the process used to form the first film 104 comprises a plasma enhanced chemical vapor deposition (PECVD) process, a low pressure CVD (LPCVD) process, a sub-atmospheric pressure CVD (SACVD) process, an atmospheric pressure (APCVD) process at atmospheric pressure, or a microwave plasma-assisted CVD (MPCVD) process, as examples. Alternatively, other methods may be used to form the first film 104. The first film 104 is formed at a temperature of about 400 degrees C. or less in some embodiments. The first film 104 is formed at a temperature of about 200 to about 300 degrees C. in some embodiments. In some embodiments, the first film 104 is formed at a temperature of about 190 degrees C. or less, as another example. Alternatively, the first film 104 may be formed at other temperatures.

The first film 104 may comprise a semiconductive material such as silicon or other semiconductors in some embodiments. The first film 104 comprises amorphous silicon (a-Si) or hydrogenated amorphous silicon (a-Si:H) in some embodiments. The first film 104 is conductive, in other embodiments. The first film 104 comprises a first porosity that is less porous than or lower than a second porosity of the second film 106. In some embodiments, the first film 104 comprises a first porosity that is less than a porosity of bulk PECVD SiN, for example. The first film 104 has a porosity of substantially 0% in some embodiments; e.g., the first film 104 has no porosity. In other embodiments, the first film 104 has a porosity of less than about 5%. The first film 104 may alternatively comprise other porosity percentages. The first film 104 has a thickness comprising dimension $d_1$, wherein dimension $d_1$ comprises about 10 Angstroms to about 400 Angstroms in some embodiments. In some embodiments, dimension $d_1$ comprises a thickness of about 500 Angstroms or less. In other embodiments, dimension $d_1$ comprises about 500 Angstroms or greater, as another example. Dimension $d_1$ comprises about 50 Angstroms or less in some embodiments, as yet another example. Alternatively, the first film 104 may comprise other materials, levels of porosity, and dimensions.

The second film 106 is deposited using a similar process and temperature as the processes and temperature ranges described for the first film 104, as shown in FIG. 3. The second film 106 comprises a thickness comprising dimension $d_2$, wherein dimension $d_2$ comprises about 900 Angstroms or less in some embodiments. Dimension $d_2$ may alternatively be greater than about 900 Angstroms in other embodiments. In some embodiments, dimension $d_2$ comprises about 100 Angstroms to about 900 Angstroms, for example. In some embodiments, a total thickness of the first film 104 and the second film 106 comprises a dimension $(d_1+d_2)$ that comprises about 900 Angstroms or less, for example. Alternatively, the second film 106 may comprise other dimensions. The second film 106 is formed at a similar temperature described for the first film 104 in some embodiments, for example.

The second film 106 comprises an insulating barrier material in some embodiments. The second film 106 comprises a passivation material layer in some embodiments, for example. In embodiments wherein the first film 104 is electrically conductive, the second film 106 is non-conductive and functions as a passivation material for the first film 104, for example. The second film 106 is electrically insulating in some embodiments, for example. The second film 106 comprises $SiO_x$, $SiN_y$, $SiO_xN_y$, amorphous $SiO_x$ (a-$SiO_x$), amorphous $SiN_y$ (a-$SiN_y$), amorphous $SiO_xN_y$ (a-$SiO_x$ $N_y$), rubber, ceramic, a polymer, an amorphous material, or combinations or multiple layers thereof in some embodiments, as examples. In some embodiments, the second film 106 comprises a silicon oxide film, for example. Alternatively, the second film 106 may comprise other materials.

In some embodiments, the second film 106 may comprise $SiO_x$ deposited at about 130 degrees C. or $SiO_x$ deposited at about 150 degrees C. in order to achieve a qualified film strength, such as a desired electrical insulating property, for example. In some embodiments, after the second film 106 is formed over the first film 104, the wafer or panel 100 is annealed at a temperature of about 400 degrees C. for about 90 minutes in an ambient $N_2$ flow to achieve a desired composite film characterization condition, for example.

The first film 104 and the second film 106 comprise a composite film 104/106 that prevents mobile ions from being released from the glass substrate 102 in some embodiments. The first film 104 comprises a low-porosity film that prevents the mobile ions from leaving the glass substrate 102, and the second film 106 comprises a passivation material and electrically insulating material for the first film 104, for example. The second film 106 also prevents warpage of the glass substrate 102. The composite film 104/106 comprises a mobile ion barrier structure. In some embodiments, forming the first film 104 and forming the second film 106 comprises forming a composite film 104/106 that prevents the mobile ions from diffusing out of the composite film 104/106.

The glass wafer or panel 100 after the treatment processes comprises a plurality of interposers 101 that can be used to package a plurality of integrated circuit dies, or one or more LCD or LED panels 101'. The wafer or panel 100 comprises a portion of an LCD panel or a portion of an LED panel, in some embodiments. The wafer or panel 100 comprises a portion of an interposer for a three-dimensional integrated circuit (3DIC) in other embodiments. The interposers 101 or LCD or LED panels 101' include the glass substrate 102 and the composite film 104/106 that includes the first film 104 and the second film 106.

Figure 4:
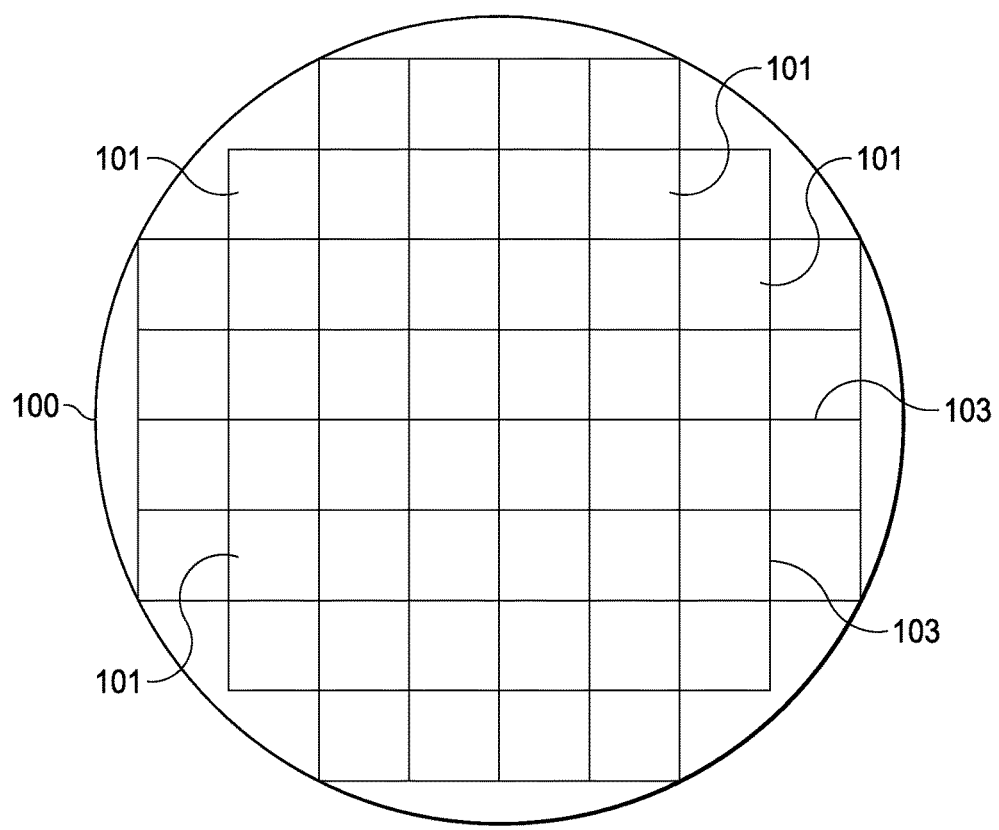
FIG. 4 is a top view of a glass wafer including a plurality of glass substrates for interposers in accordance with some embodiments.

FIG. 4 is a top view of a glass wafer 100 including a plurality of interposers 101 including the glass substrates 102 treated with the composite film 104/106 shown in FIG. 3 in accordance with some embodiments. The wafer 100 is substantially round or circular in the top view and includes an array of the plurality of interposers 101. The wafer 100 may comprise a diameter of about 6", 8", 10", 12", 18", etc., as examples. In embodiments wherein the wafer 100 is used for LED substrates, the wafer 100 may comprise diameter of 2", 3", 4", 5", as other examples. Alternatively, the wafer 100 may comprise other dimensions. After the glass substrates 102 on the wafer 100 are treated with the novel composite film 104/106 described herein, the wafer 100 may be used to package integrated circuit dies using the plurality of interposers 101, with each interposer 101 comprising one of the glass substrates 102 shown in FIG. 3. Before or after packaging integrated circuit dies on the interposers 101, the plurality of interposers 101 are singulated or separated at scribe lines 103. In accordance with some embodiments, an interposer 101 for a three-dimensional integrated circuit (3DIC) includes a portion (e.g., the interposer 101 includes one of the glass substrates 102 shown in FIG. 3) of the wafer 100. In accordance with other embodiments, an LED panel includes one of the glass substrates 102 shown in FIG. 3.

Figure 5:
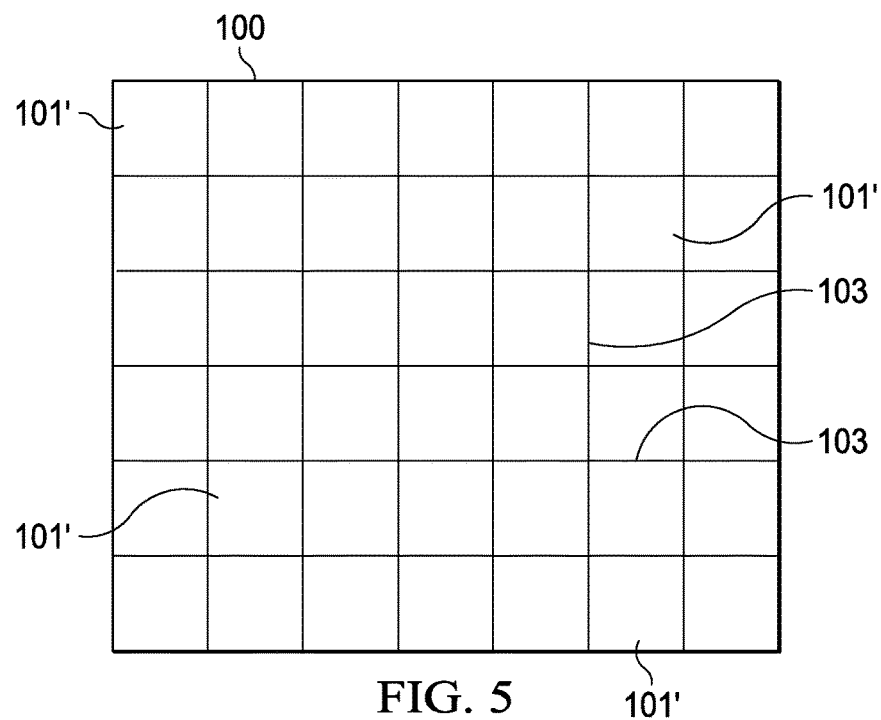
FIG. 5 is a top view of a glass panel including a plurality of glass substrates for liquid crystal display (LCD) panels or light emitting diode (LED) panels in accordance with some embodiments.

FIG. 5 is a top view of a glass panel 100 including a plurality of LCD panels or LED panels 101' in accordance with some embodiments. The glass panel 100 may be substantially square or rectangular and may include one or more LCD panels or LED panels 101', with each LCD panel or LED panel 101' comprising a glass substrate 102 treated with the composite film 104/106 shown in FIG. 3. The LCD panels or LED panels 101' may have useful applications in handheld, mobile, or other types of electronic devices, as examples. In some embodiments, the LCD panels are rigid, and in other embodiments, the LCD panels may be flexible. Advantageously, the novel composite film 104/106 described herein is thin, comprising about 900 Angstroms or less in thickness in some embodiments, so that flexibility of the LCD panels 101' is maintainable. In some embodiments, a LCD panel or LED panel 101' includes a portion of the panel 100 shown in FIG. 5 (e.g., the LCD panel or LED panel 101' includes one substrate 102 having a composite film 104/106 formed thereon, as shown in FIG. 3), for example. In other embodiments, the panel 100 comprises a single LCD panel or LED panel 101', in applications wherein the LCD panel or LED panel 101' comprises a television screen or a mobile or portable product display screen, as examples.

Figure 6:
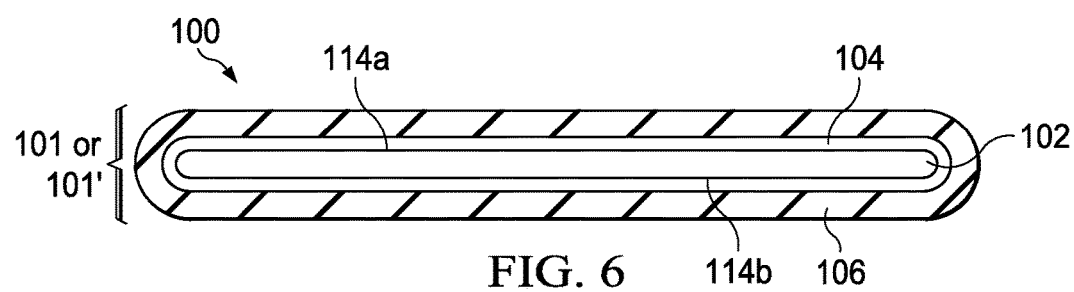
FIG. 6 is a cross-sectional view of a treatment method for a glass substrate in accordance with some embodiments.

In the embodiments shown in FIGS. 1 through 3, the first film 104 and second film 106 are formed on one side of the wafer or panel 100. In other embodiments, the first film 104 and the second film 106 are formed on both sides and all vertically cut sidewall edges of the wafer or panel 100, as shown in FIG. 6, which is a cross-sectional view of a treatment method for a glass substrate 102 in accordance with some embodiments. The first film 104 is formed over a first side 114a of the glass substrate 102 that extends in a horizontal direction, and the first film 104 is also formed over a second side 114b of the glass substrate 102 that extends in a horizontal direction, the second side 114b being opposite the first side 114a. Edges of the glass substrate 102 may also be covered with the first film 104, also shown in FIG. 6. The second film 106 is formed over the first film 104 on both sides 114a and 114b of the glass substrate 102. The second film 106 is also formed over the first film 104 on edges of the glass substrate 102 in other embodiments.

Figure 7:
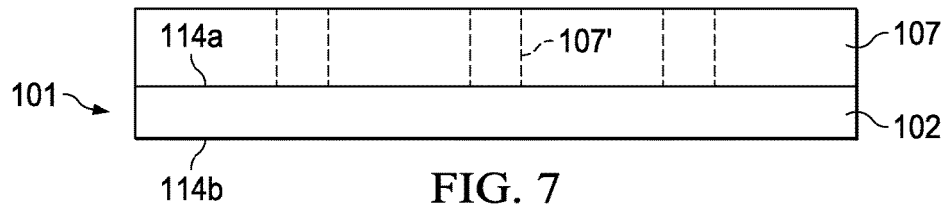
FIGS. 7 through 11 are cross-sectional views of a method of manufacturing an interposer comprising a glass substrate and packaging an integrated circuit die on the interposer in accordance with some embodiments.
Figure 8:
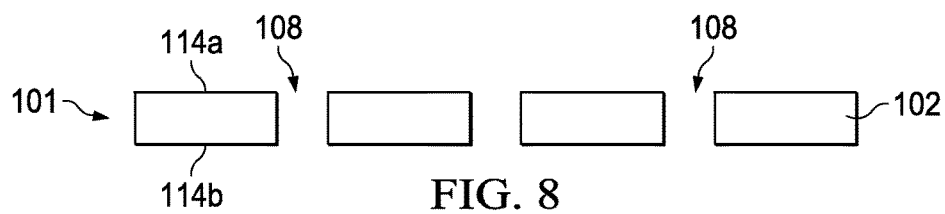

FIGS. 7 through 11 show cross-sectional views of a method of manufacturing an interposer 101 comprising a glass substrate 102 and packaging one or more integrated circuit dies 120, 120' or 120" on the interposer 101 at various stages in accordance with some embodiments. Before forming the composite film 104/106 on the glass substrate 102 that comprises a portion of a wafer 100 shown in FIG. 4, a plurality of openings or apertures 108 are formed in the glass substrate 102 using a photolithography process, as shown in FIG. 7. A layer of photoresist 107 is formed over the glass substrate 102, and the layer of photoresist 107 is patterned using a lithography process. The layer of photoresist 107 is exposed to light or energy that is reflected from or transmitted through a lithography mask (not shown) having a desired pattern thereon. The layer of photoresist 107 is developed, and exposed portions (or unexposed portions, depending on whether the layer of photoresist 107 is positive or negative) are ashed or etched away, leaving patterns 107' shown in phantom (e.g., in dashed lines) in FIG. 7 formed in the layer of photoresist 107. The layer of photoresist 107 is then used as an etch mask during an etch process for the glass substrate 102, forming openings or apertures 108 in the glass substrate 102, as shown in FIG. 8. The layer of photoresist 107 is then removed. The openings 108 in the glass substrate 102 may alternatively be formed using a drilling process or other methods, for example. The openings 108 may comprise a circular, oval, square, rectangular, octagonal, trapezoidal, or other shapes in a top view, as examples.

Figure 9:
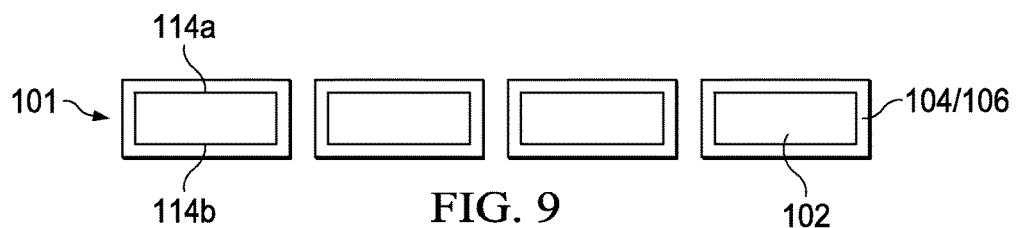
Figure 10:
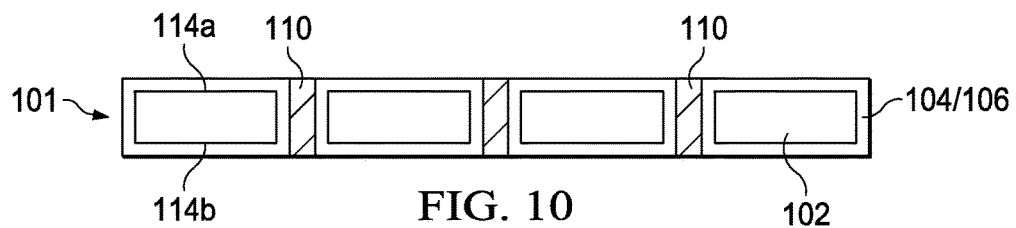

The composite film 104/106 comprising the first film 104 and the second film 106 described with reference to FIGS. 1 through 3 and 6 is then formed on the patterned glass substrate 102, as shown in FIG. 9. The composite film 104/106 is formed on the first side 114a of the glass substrate 102 and also over sidewalls of the openings 108 in the glass substrate 102. The composite film 104/106 is also formed on the second side 114b of the glass substrate 102. Referring next to FIG. 10, the openings 108 are then filled with a conductive or semiconductive material to form through-vias 110 that provide electrical connections from one side 114a of the interposer 101 to the other side 114b of the interposer 101. The through-vias 110 comprise through glass vias (TGV's) in some embodiments, for example. The through-vias 110 may comprise a diameter of about 0.1 μm to about 200 μm in some embodiments. The through-vias 110 may alternatively comprise a diameter of greater than about 200 μm in other embodiments. The conductive or semiconductive material of the through-vias 110 may also cover the sides 114a and/or 114b as deposited, and the conductive or semiconductive material may be removed from over the sides 114a and/or 114b of the glass substrate 102 using lithography and/or a chemical-mechanical polish (CMP) process, for examples. Portions of the conductive or semiconductive material may be left remaining over portions of the through-vias 110 in some embodiments, not shown. The plurality of TGV's 110 is disposed substantially within an entire thickness of the interposer 101 that includes the glass substrate 102. In other embodiments, the plurality of TGVs 110 may be slightly recessed below or raised above a surface of the composite film 104/106 and/or glass substrate 102, not shown.

Figure 11:
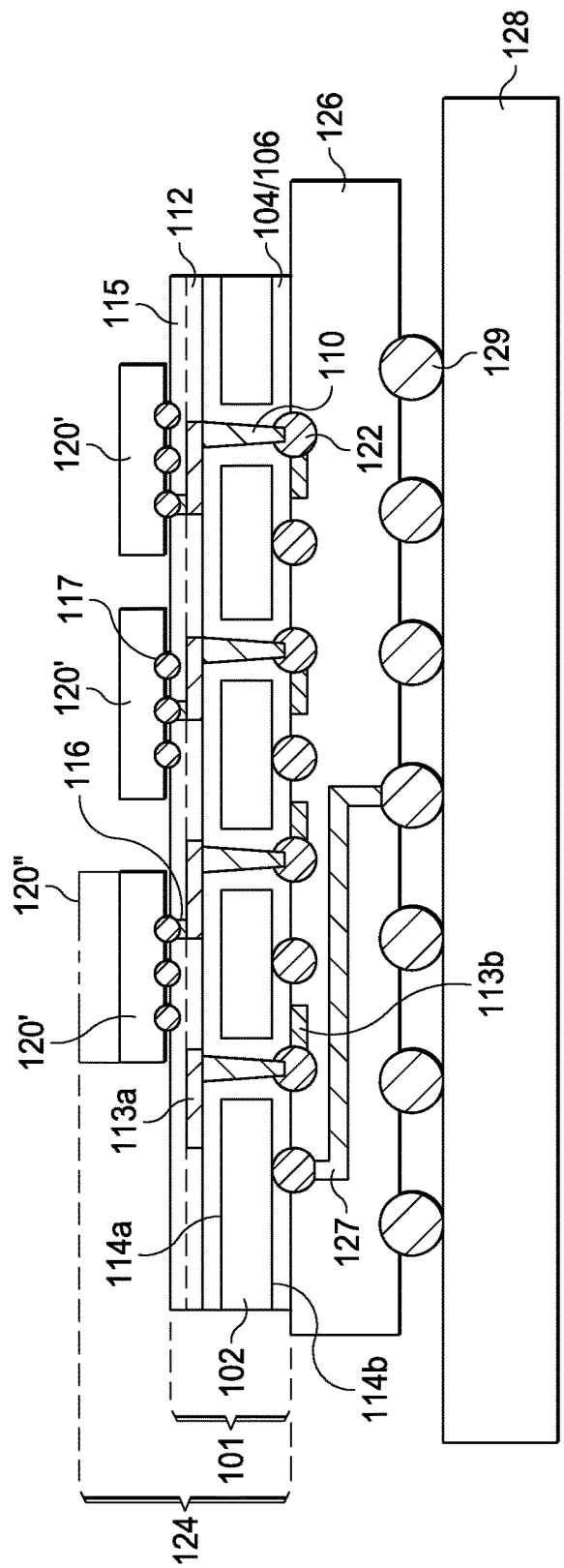

In some embodiments, a redistribution layer (RDL) 113a and/or 113b is formed on one or more sides 114a and/or 114b, respectively, of an interposer 101 comprising the glass substrate 102, as shown in FIG. 11. In the embodiment shown in FIG. 11, a first RDL 113a comprising conductive lines or wiring is formed on a first side 114a of the interposer 101 within an insulating material 112, and a second RDL 113b comprising conductive lines or wiring is formed on a second side 114b of the interposer 101. The second side 114b of the interposer 101 is opposite from the first side 114a. The first RDL 113a includes conductive traces and may include an underball metallization (UBM) structure in some embodiments. The second RDL 113b includes conductive traces and contact pads that conductive balls 122 are formed thereon in some embodiments. The first RDL 113a and/or the second RDL 113b provide horizontal electrical connections for the interposer 101, and the TGV's 110 comprise vertical electrical connections for the interposer 101. The RDLs 113a and/or 113b may include fan-out regions of wiring, for example. An insulating material 115 comprising an insulator, polymer, or other materials is formed over the first RDL 113a, between the first RDL 113a and integrated circuit dies 120, 120', and 120" mounted on the interposer 101. In some embodiments, insulating material 115 comprises polybenzoxazole (PBO), as an example. Alternatively, insulating material 115 may comprise other materials.

The interposer 101 including the glass substrate 102 having the novel composite film 104/106 formed thereon may then be used to package one or more integrated circuit dies 120, 120' and 120", also shown in FIG. 11. The integrated circuit dies 120, 120', and 120" include a workpiece comprising silicon or other semiconductor materials which includes active components or circuits (not shown) formed thereon, such as conductive layers and/or semiconductor elements, such as transistors, diodes, resistors, capacitors, inductors, etc. Multiple integrated circuit dies 120 and 120' may be stacked horizontally or vertically (shown in phantom at 120") over the interposer 101 and packaged together. Contact pads (not shown) on the integrated circuit dies 120 and 120' can be coupled to portions of the RDL 113a by conductive bumps 117, which may comprise microbumps or other types of electrical connections, for example. The dies 120 and 120' (and/or dies 120") may be coupled to the interposer 101 using a chip-on-wafer (CoW) process, wherein the dies 120 and 120' (and/or dies 120") are attached to the interposers 101 still in a wafer form as shown in FIG. 4. After attaching the dies 120 and 120' (and/or dies 120"), then the interposers 101 are singulated to form a plurality of packaged semiconductor devices 124. The packaged semiconductor devices 124 comprise CoW devices in some embodiments, for example. The packaged semiconductor devices 124 may include a plurality of conductive bumps 122 coupled to contact pads (which may be part of or coupled to the RDL 113b) disposed on the second side 114b of the interposer 101 in some embodiments, also shown in FIG. 11. The conductive bumps 122 may comprise controlled collapse chip connection (C4) bumps or other types of electrical connections, for example.

The conductive bumps 122 can be used to couple the packaged semiconductor device 124 to a package substrate 126, to another packaged semiconductor device, or to a board or other object in an end application, as examples. For example, the conductive bumps 122 are coupled to a package substrate 126 in the embodiments shown in FIG. 11. The package substrate 126 includes wiring 127 formed therein that may comprise fan-out wiring, for example. The conductive bumps 122 on the interposer 101 are coupled to contact pads (not shown) on the package substrate 126, and a eutectic material of the conductive bumps 122 is re-flowed to attach the interposer to the package substrate 126. The packaged semiconductor device 124 attached to the package substrate 126 comprises a CoW on substrate (CoWoS) device in some embodiments, for example.

The package substrate 126 may include contact pads on the bottom surface, and a plurality of solder balls 129 may be coupled to the package substrate 126 and used to couple the package substrate 126 to a printed circuit board (PCB) 128 or other device in an end application, for example. The solder balls 129 may be arranged in a ball grid array (BGA) on the bottom surface of the package substrate 126 in an array of rows and columns, or in other shapes, for example.

Figure 12:
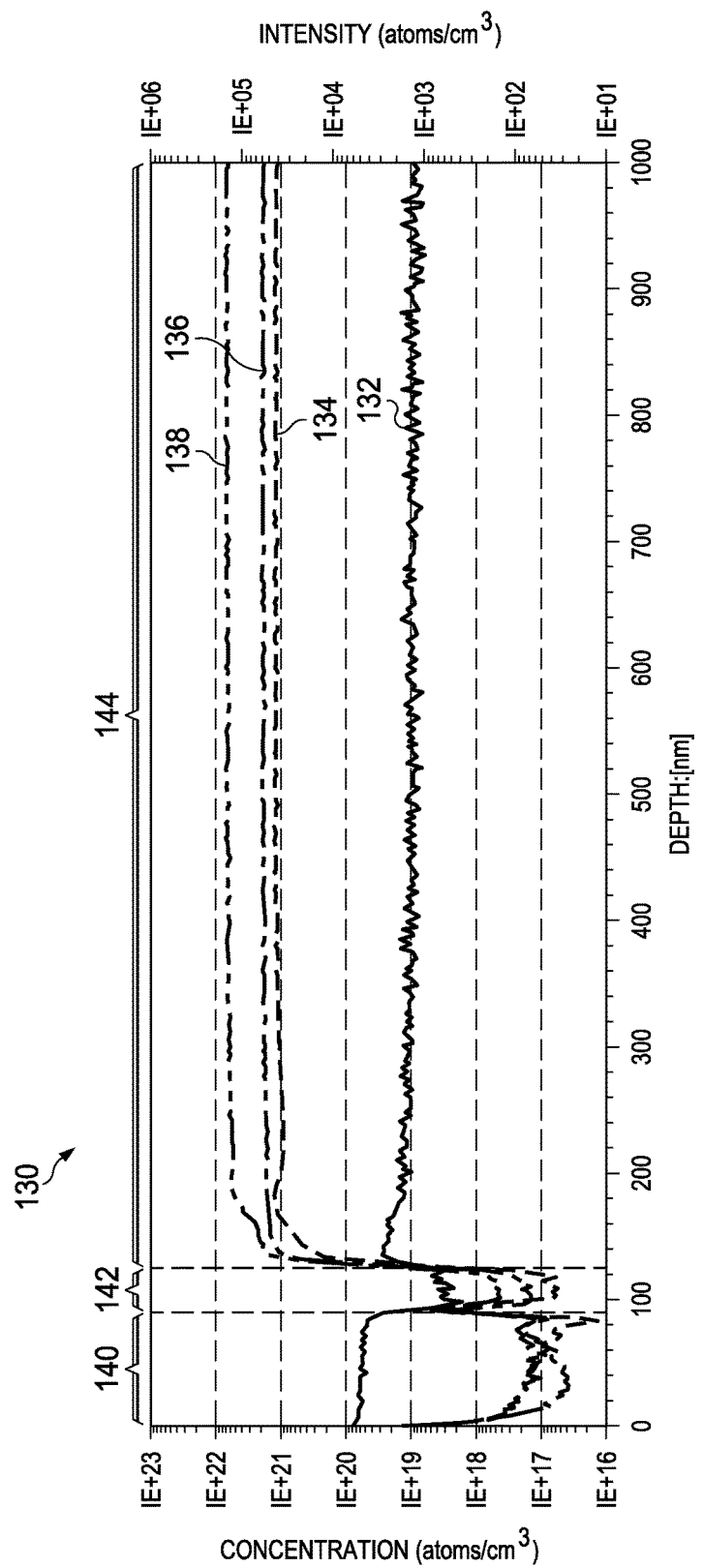
FIG. 12 is a graph illustrating material concentrations for various depths of the glass interposers described herein.

FIG. 12 is a graph 130 illustrating material concentrations in atoms/centimeter $(cm)^3$ on a y axis for various depths in nanometers (nm) on an x axis of the interposers 101 including the glass substrates 102 and novel composite film 104/106 formed thereon described herein. Intensity levels of the materials are also indicated on the y axis of the graph 130 in atomic concentration (atoms/$cm^3$). A level of $SiO_2$ is shown at 132, a level of Na is shown at 134, a level of K is shown at 136, and a level of Li is shown at 138 for a depth range from 0 to 1,000 nm of an interposer 101. Range 140 illustrates a second film 106 comprising about 900 Angstroms of $SiO_2$. Range 142 illustrates a first film 104 comprising about 400 Angstroms of a-Si. Range 144 illustrates a glass substrate 102 comprised of LBSI glass (e.g., a glass wafer 100 manufactured by LBSI). Few mobile ions are seen in range 142 of the first film 104, as can be seen below depths of about 50 nm at 134, 136, and 138. There are very few mobile ion out-diffusion gradients within range 142, for example. Relatively fewer mobile ions are seen in range 140 of the second film 106, as can be seen below depths of from 0 nm to about 50 nm at 134, 136, and 138. Thus, the first film 104 of the composite film 104/106 comprises an effective barrier against mobile ions in the glass substrate 102.

Figure 13:
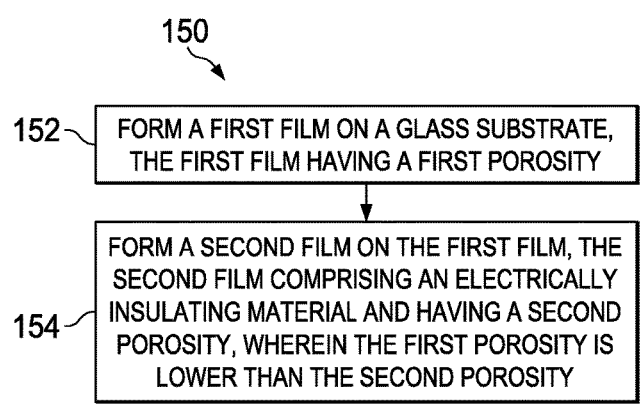
FIG. 13 is a flow chart of a method of treating a glass substrate in accordance with some embodiments.

FIG. 13 is a flow chart 150 of a method of treating a glass substrate 102 in accordance with some embodiments. In step 152, a first film 104 is formed on a glass substrate 102, the first film having a first porosity. In step 154, a second film 106 is formed on the first film 104, the second film 106 comprising an electrically insulating material and having a second porosity. The first porosity is lower than the second porosity.

In the embodiments shown in FIGS. 7 through 10, the TGVs 110 are formed before the novel composite film 104/106 is applied. Alternatively, in other embodiments, the TGVs 110 can be formed after the novel composite film 104/106 is applied, e.g., after the processing steps shown in FIG. 3 or 6. The TSV 110 sidewalls are not lined with the composite film 104/106 in these embodiments, for example.

Some embodiments of the present disclosure include methods of treating glass substrates 102, and also include wafers or panels 100 having glass substrates 102 that have been treated with the novel composite films 104/106 described herein. Some embodiments include interposers 101 for packaging semiconductor devices, such as one or more integrated circuit dies 120, 120', or 120" in chip on wafer on substrate (CoWoS) (e.g., wherein the interposer 101 is attached to a package substrate 126 as shown in FIG. 11) or other types of wafer level packaging (WLP). Some embodiments of the present disclosure also include LCD panels and LED panels that include the glass substrates 102 treated with the novel composite films 104/106 described herein.

Advantages of some embodiments of the disclosure include providing novel composite films 104/106 that provide effective composite barrier structures for containing glass interposer mobile ion out-diffusion. The composite films 104/106 also prevent glass wafer or panel 100 warpage because of their relatively thin thicknesses required in comparison with conventional 3DIC CoWoS packaging products. The first film 104 comprises a low porosity passivation barrier that blockades mobile ion out-diffusion from the glass substrates 102. In some embodiments, the first film 104 comprises a thickness of about 50 Angstroms or less, which provides a low cost production advantage, a minimal amount of thermal and mechanical stress, and the least amount of wafer warpage. The composite film 104/106 has good chemical and mechanical adhesion with the underlying glass substrate 102 and TGV's 110 formed in the interposers 101. The second film 106 is thin, comprising a thickness of about 900 Angstroms or less in some embodiments, which also results in a low cost production advantage. The first film 104 and second film 106 can be deposited at low temperatures of about 150 degrees C. or less, providing a cost savings and a thermal budget savings. The composite films 104/106 have low thermal expansion, stress, and strain impact because of their relatively thin thicknesses. The films 104/106 are easily implementable in manufacturing and packaging process flows.

In some embodiments, forming the first film 104 and forming the second film 106 comprises forming a composite film 104/106 that causes a first amount of warpage of the glass substrate 102. The first amount of warpage is less than an amount of warpage of the glass substrate 102 from a 2,000 Angstrom thick layer of silicon nitride film in some embodiments, for example.

The composite films 104/106 have useful application in technical fields that utilize glass substrates 102, such as interposers 101 for 3DIC packaging and panels 101' for thin film transistors (TFT's), LCD panels, LED panels, and other applications that may be sensitive to mobile ion out-diffusion. The second film 106 of the composite films 104/106 provides excellent electrical isolation, which is particularly advantageous in 3DIC CoWoS packaging applications, for example. The glass substrates 102 that include the composite films 104/106 disposed thereon are particularly advantageous when used in high frequency commercial products and end applications that have a high data rate. Interposers 101 including the glass substrates 102 treated with the composite film 104/106 can be used in place of conventional silicon interposers, for example. The glass substrates 102 including the composite films 104/106 are adapted to fully confine radio frequency (RF) signals with very little to no transmission signal loss in some applications, for example.

The glass substrates 102 including the composite films 104/106 can be implemented in 3DIC packaging for heterogeneous system integration of a 20 nm logic processer, a 65 nm RF device, and a 45 nm memory device within a single CoWoS package in some applications, for example. The glass substrates 102 including the composite films 104/106 are implementable in high-frequency mobile communication devices (e.g., as high or higher than 60 GHz) such as i-phones, i-pads, ultrabooks, smart phones, smart TVs, and cloud computing devices. The glass substrates 102 including the composite films 104/106 are implementable in end products such as LCD panels, 3D light emitting diode (LED) smart TV's, organic LED's (OLED's), smart phone displays, and other applications, as examples. The novel composite films 104/106 provide cost-effective methods of blocking out-diffusion of poisonous mobile ions from the glass substrates 102 while requiring low temperatures for including the composite films 104/106 in the interposers, LCD panels, and/or LED panels, and other structures.

In accordance with some embodiments of the present disclosure, a method of forming a wafer or panel includes forming an opening through a glass substrate, forming a composite film on the glass substrate and on sidewalls of the opening, and filling the opening.

In accordance with other embodiments, a method of forming a wafer or panel includes forming a plurality of openings in a glass substrate, forming a first film on the glass substrate and on sidewalls of the plurality of openings, and forming a second film on the first film. The second film comprises an electrically insulating material. The method further includes filling the plurality of openings to form a plurality of vias extending through the glass substrate.

In accordance with other embodiments, a wafer or panel comprises a glass substrate having a first side and a second side, a plurality of vias extending from the first side to the second side, and a composite film disposed on sidewalls of the plurality of vias.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a wafer or panel, the method comprising:
   forming an opening through a glass substrate;
   forming a composite film on the glass substrate and on sidewalls of the opening, wherein the forming the composite film comprises:
      forming a first film on the glass substrate and along the sidewalls of the opening; and
      forming a second film on the first film, wherein the first film has a first porosity that is lower than a second porosity of the second film;
   after forming the composite film, performing an annealing process; and
   filling the opening.

2. The method of claim 1, wherein the composite film comprises a material that reduces out-diffusion of mobile ions from the glass substrate.

3. The method of claim 1, wherein the first film and the second film are formed using a similar deposition method and at a similar temperature.

4. The method of claim 1, wherein the composite film reduces warpage of the glass substrate.

5. The method of claim 1, wherein the annealing process is performed at a temperature of about 400 C.° for about 90 minutes in an ambient $N_2$ flow.

6. The method of claim 1, wherein the filling the opening uses a semiconductive filling material.

7. The method of claim 6, further comprising:
   after the filling the opening, removing excess filling material using a lithography or a chemical-mechanical polishing process.

8. A method of forming a wafer or panel, the method comprising:
   forming a plurality of openings in a glass substrate;
   forming a first film on the glass substrate and on sidewalls of the plurality of openings;
   forming a second film on the first film, the second film comprising an electrically insulating material; and
   filling the plurality of openings using a semiconductive material to form a plurality of vias extending through the glass substrate.

9. The method of claim 8, wherein the first film and second film form a composite film to reduce out-diffusion of mobile ions from the glass substrate.

10. The method of claim 8, wherein the first film has a first porosity that is lower than a second porosity of the second film.

11. The method of claim 8, wherein the first film comprises a semiconductive or conductive material.

12. The method of claim 8, wherein the first film contacts an exterior surface of the glass substrate and extends away from the glass substrate, wherein two end surfaces of each of the plurality of vias raise above or recess below a respective nearest surface of the second film.

13. A method comprising:
providing a glass substrate having a first side and a second side;
forming a plurality of vias extending from the first side to the second side; and
depositing a composite film on sidewalls of the plurality of vias, comprising:
depositing a first film; and
depositing a second film on the first film, wherein a first porosity of the first film is lower than a second porosity of the second film.

14. The method of claim 13, wherein the composite film is further deposited on at least one of the first side and the second side.

15. The method of claim 13, wherein the depositing the first film comprises depositing a semiconductive or conductive material.

16. The method of claim 13, wherein the depositing the second film comprises depositing an electrically insulating material.

17. The method of claim 1, wherein the first film has a porosity of less than about 5%.

18. The method of claim 8, further comprising annealing the first film and the second film after the forming the second film on the first film.

19. The method of claim 8, further comprising forming a redistribution layer on the second film.

20. The method of claim 19, further comprising attaching a semiconductor die to the redistribution layer.

* * * * *